United States Patent [19]

Miller, Jr.

[11] Patent Number: 4,842,184
[45] Date of Patent: Jun. 27, 1989

[54] METHOD AND APPARATUS FOR APPLYING SOLDER PREFORMS

[75] Inventor: Grady A. Miller, Jr., Grand Prairie, Tex.

[73] Assignee: LTV Aerospace & Defense Company, Grand Prairie, Tex.

[21] Appl. No.: 210,736

[22] Filed: Jun. 23, 1988

[51] Int. Cl.⁴ .................................. B23K 35/14
[52] U.S. Cl. ........................ 228/180.1; 228/253; 228/255; 228/41; 228/56.3
[58] Field of Search ............. 228/180.1, 253, 255, 228/41, 56.3; 269/903

[56] References Cited

U.S. PATENT DOCUMENTS

| | | | |
|---|---|---|---|
| 2,913,634 | 11/1959 | Scoville | 317/101 |
| 2,977,562 | 3/1961 | Benson | 339/17 |
| 3,396,894 | 8/1968 | Ellis | 228/56.3 |
| 3,569,607 | 3/1971 | Martyak et al. | 174/685 |
| 3,591,922 | 7/1971 | Pardee | 29/626 |
| 3,932,934 | 1/1976 | Lynch et al. | 29/628 |
| 4,209,893 | 7/1980 | Dyce et al. | 228/56.3 |
| 4,216,350 | 8/1980 | Reid | 228/246 |
| 4,354,629 | 10/1982 | Grassauer et al. | 228/56.3 |
| 4,449,769 | 5/1984 | Kobayashi et al. | 339/17 |
| 4,484,704 | 11/1984 | Grassauer et al. | 228/56.3 |
| 4,551,914 | 11/1985 | Stiggelbout | 29/837 |
| 4,641,426 | 2/1987 | Hartman et al. | 29/839 |
| 4,663,815 | 5/1987 | Hartman et al. | 29/839 |
| 4,705,205 | 11/1987 | Allen et al. | 228/56.3 |

FOREIGN PATENT DOCUMENTS 86679  6/1980  Japan ................... 228/56.3

OTHER PUBLICATIONS

3M, New Mask Plus II Water Soluble Wave Solder Tape, 1986.

Primary Examiner—Nicholas P. Godici
Assistant Examiner—Samuel M. Heinrich
Attorney, Agent, or Firm—Arnold, White & Durkee

[57] ABSTRACT

A method of applying solder to contacts of a connector, when the contacts are spaced apart according to a given arrangement. The method includes the steps of perforating a water-soluble adhesive material to form perforations in a pattern according to the given arrangement, applying solder preforms around the perforations, positioning the adhesive material to center the solder preforms around the contacts, washing off the adhesive material with water, and heating the contacts to the flow-point temperature of the solder.

12 Claims, 1 Drawing Sheet

U.S. Patent
Jun. 27, 1989
4,842,184
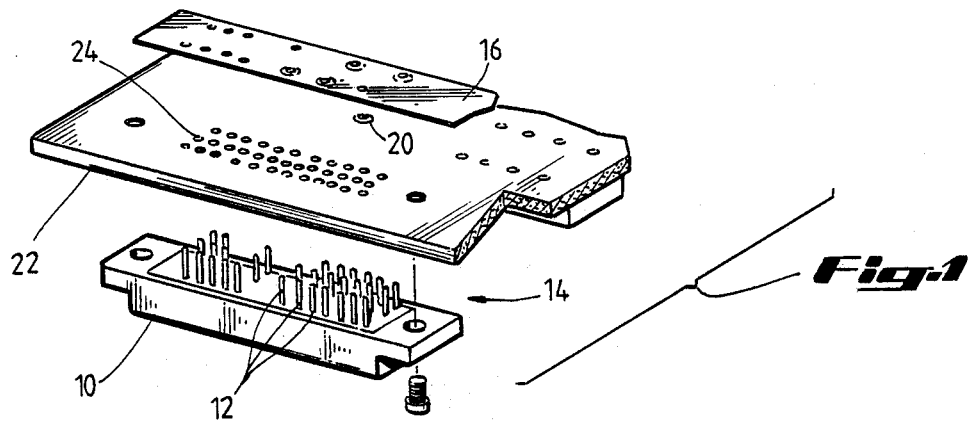
Fig.1
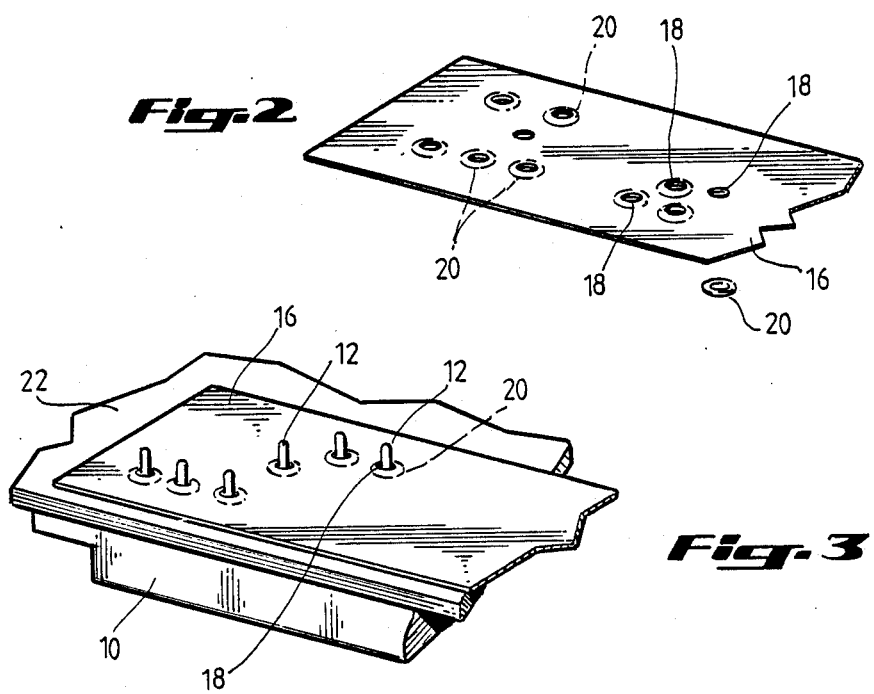
Fig.2
Fig.3
Fig.4

METHOD AND APPARATUS FOR APPLYING SOLDER PREFORMS

BACKGROUND AND SUMMARY OF THE INVENTION

Soldering connector pins to the plated-through holes of circuits boards is a labor intensive and tedious operation with many pitfalls. Too much solder may result in a short between two adjacent pins. Too little solder may result in an inadequate electrical connection between the pin and the plated-through hole. The right amount of solder wrongly placed results in too much solder on the surface of the circuit board and too little solder in the plated-through hole to make a connection that will withstand vibration.

Thus, the art has long sought a simple method that will ensure that the correct amount of solder is placed in the proper position around each pin and at each plated-through hole.

The invention overcomes the above-noted and other drawbacks of the prior art by providing a method for applying solder preforms to contacts of connectors which features a capability of depositing the exact amount of solder required in the exact position required. This invention eliminates that undesirable feature common to existing methods wherein the solder is sequentially applied to each individual contact of a connector. The invention is the first successful method of applying solder to connector contacts which simultaneously applies the desired amount of solder preforms in the correct position to all the contacts of a given connector.

In the method of the present invention, a water-soluble adhesive material is perforated to form perforations in a pattern according to the arrangement of the pins of a connector, solder preforms are applied around the perforations, the pins of the connector are inserted through the holes of a circuit board; and then the adhesive material is positioned against the circuit board to center the solder preforms around the pins. The adhesive material is then washed off, e.g., with water. Finally, the pins of the connector are heated to the flow-point temperature of the solder.

BRIEF DESCRIPTION OF THE DRAWINGS

FIG. 1 illustrates in a perspective view a connector, a printed circuit board, and a tape having solder preforms for soldering the pins of the connector to the printed circuit board;

FIG. 2 illustrates a tape perforated in accordance with the arrangement of the pins of the connector of FIG. 1;

FIG. 3 illustrates the tape of FIG. 1 and FIG. 2, with solder preforms attached, adjacent the printed circuit board of FIG. 1;

FIG. 4 is a side view illustrating the even distribution of the solder around the pins as the result of the method of the present invention.

DESCRIPTION OF THE PREFERRED EMBODIMENT

FIG. 1 illustrates in a perspective view a connector 10 having pins or contacts 12 spaced apart according to a given arrangement 14. Although a connector is shown, the method of the present invention is applicable to any pin device. Both FIG. 1 and FIG. 2 illustrate a strip 16 comprising an adhesive material perforated to form perforations 18 in a pattern corresponding to the arrangement 14. One suitable adhesive material takes the form of a tape. The tape preferably has adhesive material on one side only, but could have it on both sides. The tape is a water soluble, biodegradable tape such as Model No. YR-5414 sold by the 3M Company, St. Paul, MN.

Alternately, the adhesive material may take the form of a strip of non-adhesive material having regions of adhesive material around each perforation 18.

FIG. 2 illustrates the placing of solder preforms 20 on the adhesive material around each perforation 18.

Referring to FIG. 3, the connector 10 is attached to a circuit board 22 such that the pins 12 project through and extend beyond the circuit board 22. The side of the tape 16 with the preforms 20 is then placed adjacent the circuit board 22 with the perforations 18 aligned with the pins 12 so that the pins 12 project through the perforations and therefore through the solder preforms. The tape 16 is then removed by water wash-off or any other similar process.

Referring now to FIG. 4, known techniques are used to flow the solder preforms around the pins 12. Vapor reflow is one such technique. The solder preforms 20 melt and thus flow downwardly around the pins 12 forming an electrical connection between the pins 12 and the plated-through holes 24 of the circuit board 22.

Alternatively, the strip 16 may be comprised of material other than water soluble materials which allow it to be removed from the circuit board 22. For example, the strip 16 may be comprised of a flammable material where it is burned off during the solder flow process, or it may be a biodegradable material.

The principles, preferred embodiments and modes of operation of the present invention have been described in the foregoing specification. The invention is not to be construed as limited to the particular forms disclosed, since these are regarded as illustrative rather than restrictive. Moreover, variations and changes may be made by those skilled in the art without departing from the spirit of the invention.

What is claimed is:

1. A method of applying solder to multiple contacts of a device, the contacts spaced apart according to a given arrangement, comprising the steps of:
   a. perforating a material having first and second outer surfaces to form perforations in a pattern according to the given arrangement;
   b. applying solder preforms upon the first surface of said material adjacent the perforations;
   c. adherently contacting the preforms and the material; and
   d. relatively positioning the material and the contacts so that the contacts extend through the perforations adjacent the solder preforms and through respective solder preforms mounted upon the first surface of said material.

2. The method of claim 1 wherein the material is water soluble.

3. The method of claim 1 further comprising the step of heating the solder preforms to flow them around the contacts.

4. The method according to claim 1 wherein the material is adhesive, and the step of applying and the step of adherently contacting comprises the step of engaging the preform and the adhesive material.

5. The method according to claim 1 further including the step of removing the material after said step of relatively positioning the material and the contacts and thereafter heating the solder preforms to flow them around the contacts.

6. A method of soldering contacts to holes of a circuit board, the contacts spaced apart according to a given arrangement, comprising the steps of:
  a. perforating a soluble adhesive material to form perforations in a pattern according to the given arrangement;
  b. affixing solder preforms to the adhesive material so that each respective preform is in substantial alignment with each perforation ;
  c. positioning the adhesive material to center the solder preforms around the contacts so that the contacts pass through the preforms;
  d. dissolving the soluble adhesive material leaving the solder preforms encompassing the contacts; and
  e. heating the contacts to the flow-point temperature of the solder.

7. The method of claim 6 wherein the adhesive material is water soluble.

8. A solder contact strip for soldering contacts to holes of a circuit board comprising:
  a. a fluid-soluble strip perforated with a pattern of perforations;
  b. adhesive on one side of the strip; and
  c. a solder preform surrounding each perforation and held in position on the strip by the adhesive.

9. The solder contact strip of claim 8 wherein the pattern matches a pattern of pins on a pin device.

10. The solder contact strip of claim 8 wherein the strip is water-soluble.

11. The solder contact strip of claim 8 wherein the adhesive is a coating on the one side.

12. A solder contact strip for soldering contacts to holes of a circuit board comprising:
  a. a fluid-soluble strip perforated with a pattern of perforations;
  b. a solder preform adjacent each perforation; and
  c. adhesive holding said preform in substantial engagement with said strip.

* * * * *